(12) United States Patent
Saly et al.

(10) Patent No.: US 10,354,861 B2
(45) Date of Patent: *Jul. 16, 2019

(54) LOW TEMPERATURE MOLECULAR LAYER DEPOSITION OF SICON

(71) Applicant: Applied Materials, Inc., Santa Clara, CA (US)

(72) Inventors: Mark Saly, Santa Clara, CA (US); David Thompson, San Jose, CA (US); Lakmal C. Kalutarage, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/804,503

(22) Filed: Nov. 6, 2017

(65) Prior Publication Data

US 2018/0061629 A1 Mar. 1, 2018

Related U.S. Application Data

(63) Continuation of application No. 14/801,215, filed on Jul. 16, 2015, now Pat. No. 9,812,318.

(60) Provisional application No. 62/029,479, filed on Jul. 26, 2014.

(51) Int. Cl.
| | | |
|---|---|---|
| C23C 16/30 | (2006.01) | |
| H01L 21/02 | (2006.01) | |
| C23C 16/56 | (2006.01) | |
| C23C 16/455 | (2006.01) | |

(52) U.S. Cl.
CPC .......... *H01L 21/0228* (2013.01); *C23C 16/30* (2013.01); *C23C 16/45531* (2013.01); *C23C 16/56* (2013.01); *H01L 21/02126* (2013.01)

(58) Field of Classification Search
CPC ....... C23C 16/308; C23C 16/32; C23C 16/34; C23C 16/36; C23C 16/40
See application file for complete search history.

(56) References Cited

U.S. PATENT DOCUMENTS

| | | | |
|---|---|---|---|
| 7,294,449 B1 | 11/2007 | Gudeman et al. | |
| 8,080,282 B2 | 12/2011 | Fukazawa et al. | |
| 9,812,318 B2* | 11/2017 | Saly .................. | C23C 16/56 |
| 2004/0084774 A1 | 5/2004 | Li et al. | |
| 2006/0014399 A1 | 1/2006 | Joe | |
| 2006/0228903 A1 | 10/2006 | McSwiney et al. | |
| 2008/0050926 A1* | 2/2008 | Nakagawa ........ | H01L 21/31116 438/710 |

(Continued)

FOREIGN PATENT DOCUMENTS

| | | | | |
|---|---|---|---|---|
| WO | WO 2014/134476 | * | 9/2014 | ............. C23C 16/22 |

OTHER PUBLICATIONS

Lei Zhang, et al., "Characterization of low-dielectric-constant SiCON films grown by PECVD under different RF power." 2008 9th International Conference on Solid-State and Integrated-Circuit Technology, Beijing, 2008, pp. 788-791. doi: 10.1109/ICSICT.2008. 4734662.*

(Continued)

*Primary Examiner* — Bret P Chen
(74) *Attorney, Agent, or Firm* — Servilla Whitney LLC

(57) ABSTRACT

Methods for the deposition of a SiCON film by molecular layer deposition using a multi-functional amine and a silicon containing precursor having a reactive moiety.

20 Claims, 2 Drawing Sheets

(56) References Cited

U.S. PATENT DOCUMENTS

| | | |
|---|---|---|
| 2010/0081293 A1 | 4/2010 | Mallick et al. |
| 2013/0123528 A1 | 5/2013 | Tada et al. |
| 2013/0164946 A1 | 6/2013 | Suzuki et al. |
| 2013/0196082 A1 | 8/2013 | Spence et al. |
| 2013/0196516 A1 | 8/2013 | Lavoie et al. |
| 2014/0170858 A1 | 6/2014 | Harada et al. |
| 2016/0002039 A1* | 1/2016 | Thompson ............ C23C 16/308 427/553 |
| 2017/0130033 A1* | 5/2017 | Yun .......................... C08K 9/02 |
| 2017/0140925 A1* | 5/2017 | Suzuki .............. H01L 21/02216 |

OTHER PUBLICATIONS

Qian, KJ, et al., "Preparation and characterization of low-dielectric-constant F-doped SiOCN films by PECVD". ICSICT-2010-2010 10th IEEE International Conference on Solid-State and Integrated Circuit Technology, Proceedings. 10.1109/ICSICT.2010.5667518.*

J. Phys. IV France 11 Numero PR3, Thirteenth European Conference on Chemical Vapor Deposition. (2001) Pr3-1005-Pr3-1012. Abstract Only.*

Goldman, Lee M., et al., "Durable Coatings for IR Windows". Window and Dome Technologies and Materials IV, edited by Randal W. Tustison. Proceedings of SPIE vol. 5786, pp. 381-392.*

PCT International Preliminary Report on Patentability in PCT/US2015/041977 dated Feb. 9, 2017, 5 pages.

PCT International Search Report and Written Opinion in PCT/US2015/041977 dated Oct. 29, 2015, 8 pages.

Kityk, et al., "Nonlinear optical effects in amorphous-like SiCON films", Physics Letters A 340, 2005, 466-473.

Mandracci, et al., "Silicon-carbon-oxnitrides grown by plasma-enhanced chemical vapor deposition technique", Thin Solid Films 515, 2007, 7639-7642.

Schiavon, et al., "Glasses in he Si—O—C—N system produced by pyrolysis of polycyclic silazane/siloxane networks", Journal of Non-Crystalline Solids 353, 2007, 2280-2288.

Zhang, et al., "Characterization of low-dielectric-constant SiCON films grown by PECVD under different RF power", 9th International Conference on Solid-State and Integrated-Circuit Technology, 2008, 4 pages.

* cited by examiner

LOW TEMPERATURE MOLECULAR LAYER DEPOSITION OF SICON

CROSS-REFERENCE TO RELATED APPLICATIONS

This application is a continuation of U.S. patent application Ser. No. 14/801,215, filed Jul. 16, 2015, now U.S. Pat. No. 9,812,318, issued Nov. 7, 2017, which claims priority to U.S. Provisional Application No. 62/029,479, filed Jul. 26, 2014, the entire disclosures of which are hereby incorporated by reference herein.

TECHNICAL FIELD

Embodiments of the disclosure generally relate to methods for molecular layer deposition. More specifically, embodiments of the disclosure are directed to methods for the molecular layer deposition of silicon carbon oxynitride (SiCON) films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect ratio structures.

Silicon carbon oxynitride (SiCON) is being considered for spacer and etch-stop layer applications due to a low dielectric constant (k). Excellent conformality coverage of dielectric films on high aspect ratio structures is needed as device nodes shrink down below 45 nm. Silicon carbide (oxy)nitride (SiCON/SiCN) films can exhibit some of these favorable qualities, but deposition of SiCON/SiCN films from furnace processes has several drawbacks. For example, these drawbacks include a high temperature requirement (≥550° C.), few capabilities to engineer film compositions and bonding structures. These properties impact wet etch resistance and electrical stability during thermal cycling for front-end of line (FEOL) applications. Films deposited via plasma enhanced chemical vapor deposition (PE-CVD) at lower temperature have poor step coverage due to directionality of the radicals' fluxes.

Accordingly, there is a need for improved methods for depositing various silicon containing films such as SiCN.

SUMMARY

One or more embodiments of the disclosure are directed to methods of depositing a film. At least a portion of a substrate surface is exposed to a first precursor comprising a multi-functional amine to form an amine-containing film on the substrate surface. The amine-containing film is exposed to a second precursor comprising at least one silicon atom and at least one reactive moiety to form an SiCON film on at least a portion of the substrate surface.

Additional embodiments of the disclosure are directed to methods of depositing a film. At least a portion of a substrate surface is exposed to a first precursor comprising a multi-functional amine to form an amine-containing film on the substrate surface. The first precursor comprises a compound having the formula selected from the group consisting of

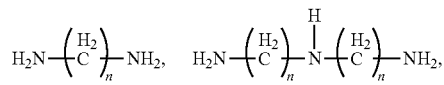

and combinations thereof, where n is in the range of about 1 and about 6. Unreacted first precursor is removed from the substrate surface. The amine-containing film is exposed to a second precursor comprising at least one silicon atom and at least one reactive moiety to form an SiCON film on at least a portion of the substrate surface. The reactive moiety is selected from the group consisting of isocyanato, aldehyde, ketone, acyl chloride, anhydrides and combinations thereof. Unreacted second precursor is removed from the substrate surface.

Further embodiments of the disclosure are directed to methods of depositing a film. At least a portion of a substrate surface is exposed to a first precursor comprising a multi-functional amine to form an amine-containing film on the substrate surface at a temperature in the range of about 50° C. to about 200° C. The first precursor comprises a compound having the formula selected from the group consisting of

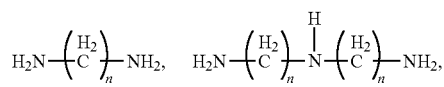

and combinations thereof, where n is in the range of about 1 and about 6. Unreacted first precursor is removed from the substrate surface. The amine-containing film is exposed to a second precursor comprising at least one silicon atom and at least one reactive moiety to form an SiCON film on at least a portion of the substrate surface at a temperature in the range of about 50° C. to about 200° C. The reactive moiety is selected from the group consisting of isocyanato, aldehyde, ketone, acyl chloride, anhydrides and combinations thereof. Unreacted second precursor is removed from the substrate surface. The exposure of at least a portion of the substrate surface to the first precursor, removing reacted first precursor, exposure to the second precursor and removing unreacted second precursor is sequentially repeated to form an SiCON film of a chosen thickness. The SiCON film is annealed in a gas selected from the group consisting of silane, dichlorosilane, trichlorosilane, ammonia, oxygen and combinations thereof.

BRIEF DESCRIPTION OF THE DRAWINGS

Further features of embodiment of the present disclosure, their nature and various advantages will become more apparent upon consideration of the following detailed description, taken in conjunction with the accompanying drawings, which are also illustrative of the best mode contemplated by the applicants, and in which like reference characters refer to like parts throughout, where.

DETAILED DESCRIPTION

Figure 1:
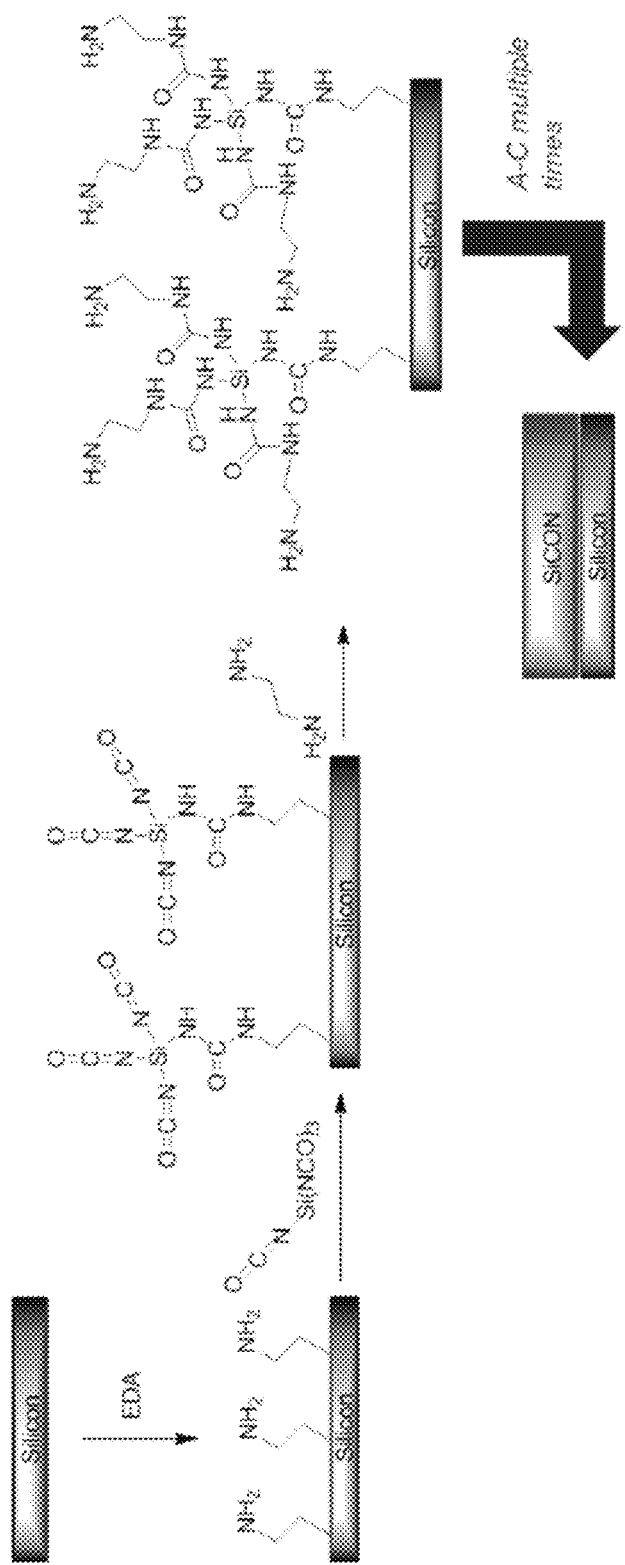
FIG. 1 illustrates an exemplary MLD process in accordance with one or more embodiment of the disclosure as described in the Example.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the embodiments of the present disclosure any of the film processing steps disclosed may also be performed on an underlayer formed on the substrate as disclosed in more detail below, and the term "substrate surface" is intended to include such underlayer as the context indicates.

One or more embodiments of the disclosure use a variant of atomic layer deposition (ALD) called molecular layer deposition (MLD). MLD processes can be used to deposit polymers such as polyimide, polyamide, or polyurea. For example, MLD of polyurea may be performed by alternating exposures of 1,4-diisocyanatobutane with various amines, such as ethylenediamine or tris(2-aminoethyl)amine. The inventors have surprisingly found that silicon precursors comprising reactive moieties can also be deposited by MLD. Reactive moieties such as isocyanato groups (see equation 1), aldehydes or ketones (see equation 2), acyl chlorides (see equation 3) and anhydrides (see equation 4) can participate in MLD reactions with various amines such as ethylenediamine.

Equations 1-4 show common organic reactions that occur between amines and aldehydes, ketones, acyl chlorides and anhydrides.

Equation 1

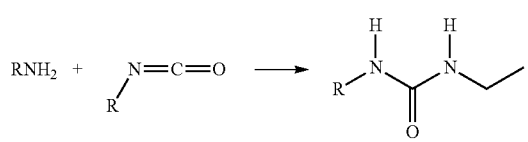

Equation 2

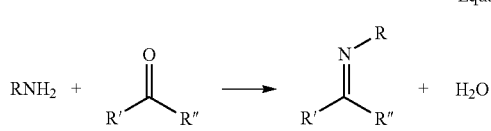

Equation 3

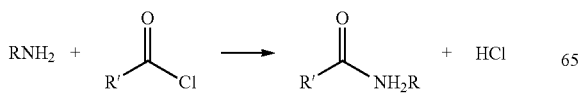

Equation 4

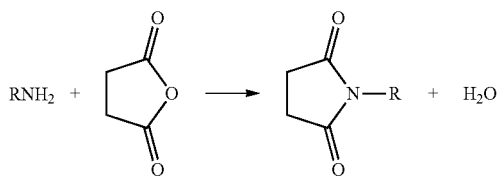

In some embodiments, the amine is at least bifunctional so that one amine can react with the substrate surface while the other amine may remain unreacted to participate in a subsequent ALD half-reaction.

The inventors have found that a network of silicon, carbon, oxygen and nitrogen can be deposited using two precursors. While the term SiCON is used to describe a film having silicon, carbon, oxygen and nitrogen, it will be understood by those skilled in the art that no stoichiometry is intended by such formula. For example, an SiCON film is not limited to films with equal numbers of silicon, carbon, oxygen and nitrogen atoms, the term SiCON is merely representative of the majority makeup of the film. Additionally, it will be understood that an SiCON film may also contain some other impurities or trace elements. For example, an SiCON film may contain up to about 5% on an atomic basis of other elements, or up to about 4%, or up to about 3%, or up to about 2%, or up to about 1%, or up to about 0.5%, or up to about 0.2%.

In some embodiments, the amine is modified to contain more than two $NH_2$ groups. Without being bound by any particular theory of operation, it is believed that the amines can cross link the film and increase the mechanical strength.

One or more embodiments of the disclosure involve the low temperature MLD of SiCON by the following method: First, a multifunctional amine is transported to a reaction chamber which will react with a substrate to form a layer of $NH_2$ groups on the surface. Next a purge is performed to get rid of any unreacted amine Next a Si precursor is transported to the reactor chamber so that the precursor reacts with the $NH_2$ groups on the surface to form new carbon to nitrogen bonds. The chamber is purged to get rid of any unreacted Si precursor. Multiple cycles of this process should result in the low temperature deposition of SiCON. The deposition temperature can be 50° C.-200° C., and the pressures would be 0-300 Torr.

The quality of the film can vary depending on a number of factors. The film formed might be of poor quality because of the low temperature and the relatively low density of the deposited film. In some embodiments, annealing under gases such as ($H_2SiCl_2$, $SiCl_3$, silane, $NH_3$, $O_2$, etc.) may help densify the film and also tune the film's properties.

Accordingly, one or more embodiment of the disclosure is directed to methods of depositing a film. At least a portion of a substrate surface is exposed to a first precursor comprising a multi-functional amine to form an amine-containing film on the substrate surface. In some embodiments, the multi-functional amine comprises two amine groups, three amine groups, four amine groups, five amine groups or more.

In some embodiments, the first precursor comprises a compound having the formula

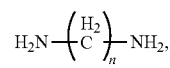

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6.

In some embodiments, the first precursor comprises a compound having the formula

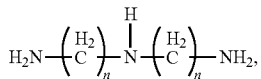

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6.

In some embodiments, the first precursor comprises a compound having the formula

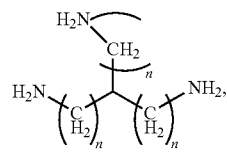

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6.

In some embodiments, the first precursor comprises a compound having the formula selected from the group consisting of

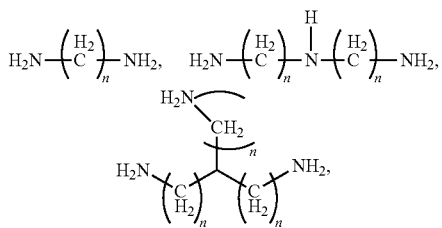

or combinations thereof, where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6.

In some embodiments, after exposure to the first precursor, the processing chamber, or substrate surface may be purged of excess or unreacted first precursor. This prevents any gas phase reactions between the first precursor and a subsequent second precursor. When a chemical vapor deposition (CVD) reaction is intended, there is no need to purge between the exposure to the first and second precursor. For a CVD reaction, the first and second precursors may be exposed simultaneously.

In a traditional time-domain ALD process, the entire processing chamber might be purged of the first precursor before exposure to the second precursor. In a spatial ALD process, the first precursor and the second precursor are flowed into separate portions of the processing chamber and are separated by a gas curtain to prevent gas phase reactions. In the spatial process, the substrate is moved between the different regions of the processing chamber through the gas curtain so that different portions of the substrate are exposed to the first and second precursors at the same time.

In the ALD type process, after formation of the amine-containing film, the amine-containing film can be exposed to a second precursor. The second precursor comprises a silicon atom and at least one reactive moiety to form an SiCON film on at least a portion of the substrate surface. In some embodiments, the reactive moiety of the second precursor comprises an isocyanato group. In some embodiments, the reactive moiety of the second precursor comprises an aldehyde. In some embodiments, the reactive moiety of the second precursor comprises a ketone. In some embodiments, the reactive moiety of the second precursor comprises an acyl chloride. In some embodiments, the reactive moiety of the second precursor comprises an anhydride. In some embodiments, the reactive moiety of the second precursor is selected from the group consisting of isocyanato, aldehyde, ketone, acyl chloride, anhydride and combinations thereof.

In one or more embodiments, the second precursor comprises a compound having the formula

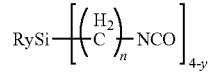

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6, y is in the range of about 1 to about 3 and R is selected from the group consisting of hydrogen, alkyl groups, amino groups and combinations thereof.

In some embodiments, the second precursor comprises a compound having the formula

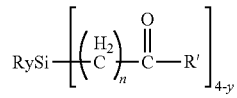

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6, y is in the range of about 1 to about 3, R is selected from the group consisting of hydrogen, alkyl groups, amino groups and combinations thereof and R' is selected from the group consisting of hydrogen, alkyl groups or halides.

In some embodiments, the second precursor comprises a compound having the formula

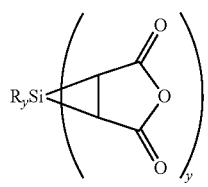

where each y is independently in the range of about 1 to about 2 and R is selected from the group consisting of hydrogen, alkyl groups, amino groups and combinations thereof.

In one or more embodiments, the second precursor comprises a compound having the formula selected from one or more of

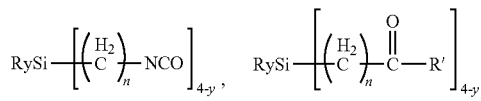

where n is up to about 16, or up to about 15, or up to about 14, or up to about 13, or up to about 12, or up to about 11, or up to about 10, or up to about 9, or up to about 8, or up to about 7, or up to about 6 or in the range of about 1 to about 8, or in the range of about 1 to about 6, y is in the range of about 1 to about 3 and R is selected from the group consisting of hydrogen, alkyl groups, amino groups and combinations thereof,

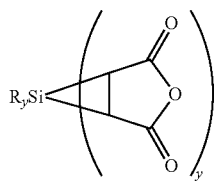

where each y is independently in the range of about 1 to about 2 and R is selected from the group consisting of hydrogen, alkyl groups, amino groups and combinations thereof.

In some embodiments, after exposure to the second precursor, the processing chamber, or substrate surface may be purged of excess or unreacted second precursor. This prevents any gas phase reactions between the second precursor and a subsequent first precursor.

Some embodiments of the method further comprise annealing the SiCON film. The film can be annealed under an inert atmosphere or a reactive atmosphere. Without being bound by any particular theory of operation, it is believed that annealing the film can result in densification and strengthening of the film. In one or more embodiments, the film is annealed in an environment comprising a silicon-containing gas. In one or more embodiments, the film is annealed under a gas selected from the group consisting of silane, dichlorosilane, trichlorosilane, ammonia, oxygen and combinations thereof.

The temperature of the deposition process can be less than about 400° C., 350° C., 300° C., 250° C. or 200° C. In some embodiments, the deposition temperature of the substrate surface during either the first precursor exposure, the second precursor exposure or both the first and second precursor exposures can be less than about 400° C., 350° C., 300° C., 250° C. or 200° C. In one or more embodiments, the substrate surface is maintained at a temperature in the range of about 25° C. to about 400° C., or in the range of about 50° C. to about 300° C. or in the range of about 50° C. to about 200° C. during exposure to the first precursor and the second precursor.

EXAMPLE

A SiCON film was deposited by an MLD process by sequential exposure to tetraisocyanato silicon (Si(NCO)$_4$); TICS) and ethylenediamine (EDA). FIG. 1 shows an illustration of the MLD of SiCON involving TICS and ethylenediamine A silicon substrate with a native oxide was exposed to 20 seconds of ammonia plasma treatment (100 W at 0.78 Torr). The substrate temperature was maintained at 125° C. throughout deposition. The TICS bubbler was maintained at a temperature of about 70° C. and the EDA bubbler was maintained at a temperature of about 23° C. Nitrogen gas was flowed through the TICS bubbler at about 250 sccms and through the EDA bubbler at about 250 sccms. The chamber pressure was maintained at about 30-35 Torr during deposition with about 35 seconds of purge between precursors (5 seconds purge and 30 seconds pump). Two hundred cycles of first and second precursor with intervening purges was performed. A film of about 99 Å (measured by ellipsometry) of SiCON was deposited with a growth rate of about 0.5 Å/cycle.

Figure 2:
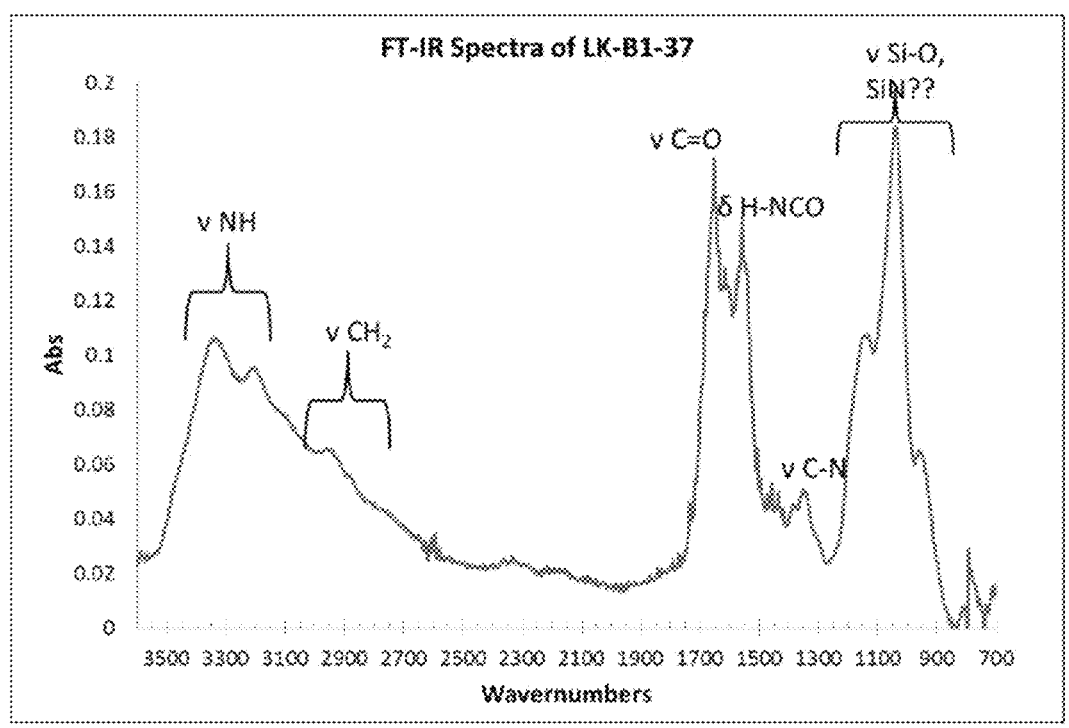
FIG. 2 shows an FTIR spectrum of the film deposited using the process of the Example as exemplified in FIG. 1.

FIG. 2 shows the FTIR spectrum of the deposited film. The FTIR spectrum is labelled with resonances believed to belong to NH, CH$_2$, C=), H—NCO, and Si—O or Si—N bonding.

X-ray photoelectron spectroscopy (XPS) results of the deposited film are shown in Table 1.

TABLE 1

XPS Results of the Film Deposited

| Time (s) | C1s Atomic % | N1s Atomic % | O1s Atomic % | Si2p Atomic % |
|---|---|---|---|---|
| 0.0 | 28.9 | 21.7 | 33.2 | 16.2 |
| 15.0 | 11.8 | 12.6 | 42.1 | 33.5 |
| 30.0 | 5.9 | 8.4 | 42.6 | 43.2 |
| 45.0 | 3.0 | 5.4 | 39.4 | 52.2 |

Reference throughout this specification to "one embodiment," "certain embodiments," "various embodiments," "one or more embodiments," "in some embodiments," or "an embodiment" means that a particular feature, structure, material, or characteristic described in connection with the embodiment may be included in at least one embodiment of the disclosure. Furthermore, the appearances of the phrases such as "in one or more embodiments," "in certain embodiments," "in some embodiments," "in one embodiment" or "in an embodiment" in various places throughout this specification are not necessarily referring to the same embodiment of the disclosure. In addition, the particular features, structures, materials, or characteristics described may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the material, method, and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
exposing at least a portion of a substrate surface to a first precursor comprising a multi-functional amine to form an amine-containing film on the substrate surface, the first precursor comprises a compound having the formula

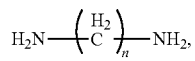

where n is in the range of about 1 and about 6; and
exposing the amine-containing film to a second precursor comprising at least one silicon atom and at least one reactive moiety to form an SiCON film on at least a portion of the substrate surface.

2. The method of claim 1, wherein the multi-functional amine comprises two amine groups.

3. The method of claim 1, wherein the multi-functional amine comprises three amine groups.

4. The method of claim 1, wherein the first precursor comprises a compound having the formula

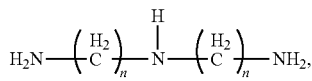

where n is in the range of about 1 and about 6.

5. The method of claim 1, wherein the first precursor comprises a compound having the formula

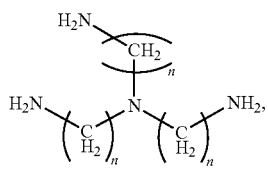

where n is in the range of about 1 to about 6.

6. The method of claim 1, wherein the reactive moiety of the second precursor comprises an isocyanato group.

7. The method of claim 1, wherein the reactive moiety of the second precursor comprises an aldehyde.

8. The method of claim 1, wherein the reactive moiety of the second precursor comprises a ketone.

9. The method of claim 1, wherein the reactive moiety of the second precursor comprises an acyl chloride.

10. The method of claim 1, wherein the reactive moiety of the second precursor comprises an anhydride.

11. The method of claim 1, wherein the second precursor comprises a compound having the formula

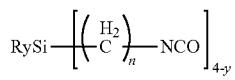

where n is in the range of about 0 to about 6, y is in the range of about 1 to about 3 and R is selected from the group consisting of hydrogen, alkyl groups, amino groups and combinations thereof.

12. The method of claim 1, wherein the second precursor comprises a compound having the formula

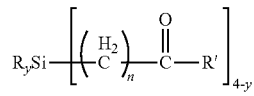

where n is in the range of about 0 to about 6, y is in the range of about 1 to about 3, R is selected from the group consisting of hydrogen, alkyl, amino and combinations thereof and R' is selected from the group consisting of hydrogen, alkyls and halides.

13. The method of claim 1, wherein the second precursor comprises a compound having the formula

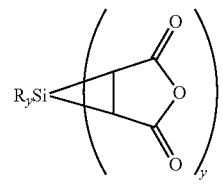

where each y is independently in the range of about 1 to about 2 and R is selected from the group consisting of hydrogen, alkyl groups, amino groups and combinations thereof.

14. The method of claim 1, further comprising annealing the SiCON film under a gas selected from the group consisting of silane, dichlorosilane, trichlorosilane, ammonia, oxygen and combinations thereof.

15. The method of claim 1, wherein the substrate surface is maintained at a temperature in the range of about 50° C. to about 200° C. during exposure to the first precursor and the second precursor.

16. The method of claim 1, wherein a portion of the substrate surface is exposed to the first precursor while a different portion of the substrate surface is exposed to the second precursor.

17. A method of depositing a film, the method comprising:
exposing at least a portion of a substrate surface to a first precursor comprising a multi-functional amine to form an amine-containing film on the substrate surface, the first precursor comprises a compound having the formula

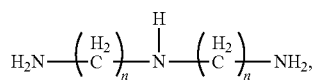

where n is in the range of about 1 and about 6;
removing unreacted first precursor from the substrate surface;
exposing the amine-containing film to a second precursor comprising at least one silicon atom and at least one reactive moiety to form an SiCON film on at least a portion of the substrate surface, the second precursor comprises a compound having the formula

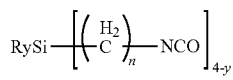

where n is in the range of about 0 to about 6, y is in the range of about 1 to about 3 and R is selected from the group consisting of hydrogen, alkyl, amino and combinations thereof, or a compound having the formula

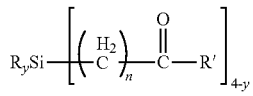

where n is in the range of about 0 to about 6, y is in the range of about 1 to about 3, R is selected from the group consisting of hydrogen, alkyl, amino and combinations thereof and R' is selected from the group consisting of hydrogen, alkyl groups and halides, or a compound having the formula

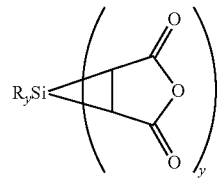

where each y is independently in the range of about 1 to about 2 and R is selected from the group consisting of hydrogen, alkyl, amino and combinations thereof; and removing unreacted second precursor from the substrate surface.

18. The method of claim 17, further comprising annealing the SiCON film under a gas selected from the group consisting of silane, dichlorosilane, trichlorosilane, ammonia, oxygen and combinations thereof.

19. A method of depositing a film, the method comprising:

exposing at least a portion of a substrate surface to a first precursor comprising a multi-functional amine to form an amine-containing film on the substrate surface at a temperature in the range of about 50° C. to about 200° C., the first precursor comprises a compound having the formula selected from the group consisting of

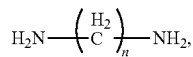

where n is in the range of about 1 and about 6;

removing unreacted first precursor from the substrate surface;

exposing the amine-containing film to a second precursor comprising at least one silicon atom and at least one reactive moiety to form an SiCON film on at least a portion of the substrate surface at a temperature in the range of about 50° C. to about 200° C., the second precursor comprises a compound having the formula

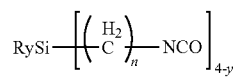

where n is in the range of about 0 to about 6, y is in the range of about 1 to about 3 and R is selected from the group consisting of hydrogen, alkyl, amino and combinations thereof, or a compound having the formula

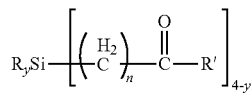

where n is in the range of about 0 to about 6, y is in the range of about 1 to about 3, R is selected from the group consisting of hydrogen, alkyl, amino and combinations thereof and R' is selected from the group consisting of hydrogen, alkyl and halides, or a compound having the formula

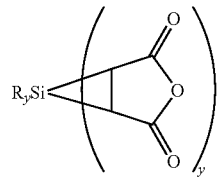

where each y is independently in the range of about 1 to about 2 and R is selected from the group consisting of hydrogen, alkyl, amino and combinations thereof;

removing unreacted second precursor from the substrate surface; and repeating sequential exposure of at least a portion of the substrate surface to the first precursor, removing reacted first precursor, exposure to the second precursor and removing unreacted second precursor to form an SiCON film of a chosen thickness.

20. The method of claim 19, further comprising annealing the SiCON film in a gas selected from the group consisting of silane, dichlorosilane, trichlorosilane, ammonia, oxygen and combinations thereof.

* * * * *